United States Patent [19]

Yoshizawa

[11] Patent Number: 4,694,527

[45] Date of Patent: Sep. 22, 1987

[54] MASK WASHING APPARATUS FOR PRODUCTION OF INTEGRATED CIRCUIT

[75] Inventor: Takeshi Yoshizawa, Kawasaki, Japan

[73] Assignee: Fujitsu Limited, Kanagawa, Japan

[21] Appl. No.: 627,578

[22] Filed: Jul. 3, 1984

[30] Foreign Application Priority Data

Jul. 6, 1983 [JP] Japan ................................ 58-122706

[51] Int. Cl.⁴ ............................................. B08B 1/04
[52] U.S. Cl. .................................. 15/308; 15/306 R;
15/302; 15/77; 134/61; 134/95; 134/133;
134/200; 51/25
[58] Field of Search .................... 134/21, 25.4, 28, 30,
134/32, 199, 200

[56] References Cited

U.S. PATENT DOCUMENTS

| | | | |
|---|---|---|---|
| 3,464,428 | 9/1969 | Kraeft | 134/133 X |
| 3,636,662 | 1/1972 | Maca | 15/308 X |
| 3,691,582 | 9/1972 | Call | 15/77 |
| 3,756,898 | 9/1973 | Frantzen et al. | 134/72 X |
| 3,995,343 | 12/1976 | Horner | 15/77 X |
| 4,027,686 | 6/1977 | Shortes et al. | 134/30 X |
| 4,079,522 | 3/1978 | Ham | 134/30 X |
| 4,129,919 | 12/1978 | Fitch et al. | 15/77 X |
| 4,132,235 | 1/1979 | Koplin et al. | 134/133 X |
| 4,231,806 | 11/1980 | Henry | 134/72 X |
| 4,268,934 | 5/1981 | Testone | 15/306 B |
| 4,296,707 | 10/1981 | Hammar | 134/21 X |
| 4,454,003 | 6/1984 | Fishman et al. | 134/72 X |
| 4,458,703 | 7/1984 | Inoue et al. | 134/109 X |
| 4,483,040 | 11/1984 | Magee et al. | 15/302 |

FOREIGN PATENT DOCUMENTS

| | | | |
|---|---|---|---|
| 52-2076 | 1/1977 | Japan | 15/77 |
| 53-136358 | 11/1978 | Japan | 134/76 |
| 55-80335 | 7/1980 | Japan | 134/56 R |
| 56-103440 | 8/1981 | Japan | 134/25.4 |
| 57-79619 | 5/1982 | Japan | 134/94 |
| 603703 | 4/1978 | U.S.S.R. | 134/25.4 |
| 951017 | 8/1982 | U.S.S.R. | 134/21 |

Primary Examiner—Harvey C. Hornsby
Assistant Examiner—Frankie L. Stinson
Attorney, Agent, or Firm—Armstrong, Nikaido, Marmelstein & Kubovcik

[57] ABSTRACT

This invention relates to a mask (reticle) washing apparatus for use in the production of semiconductor integrated circuits (IC), and in particular, to cleaning a mask without the use of a strong oxidizing agent or a strong alkaline agent. The mask washing apparatus comprises an airtight chamber including a washing space and a drying space which are separated by a shutter. A drain and an exhaust duct are located at the bottom of the chamber. The washing is performed at a lower part of the chamber and the drying is performed at an upper part of the chamber. A clean air stream flows from the upper part to the lower part of the chamber, and this flow eliminates contamination in the chamber. Consequently, the mask is cleaned perfectly, and the reliability and yield of the device is improved.

6 Claims, 7 Drawing Figures

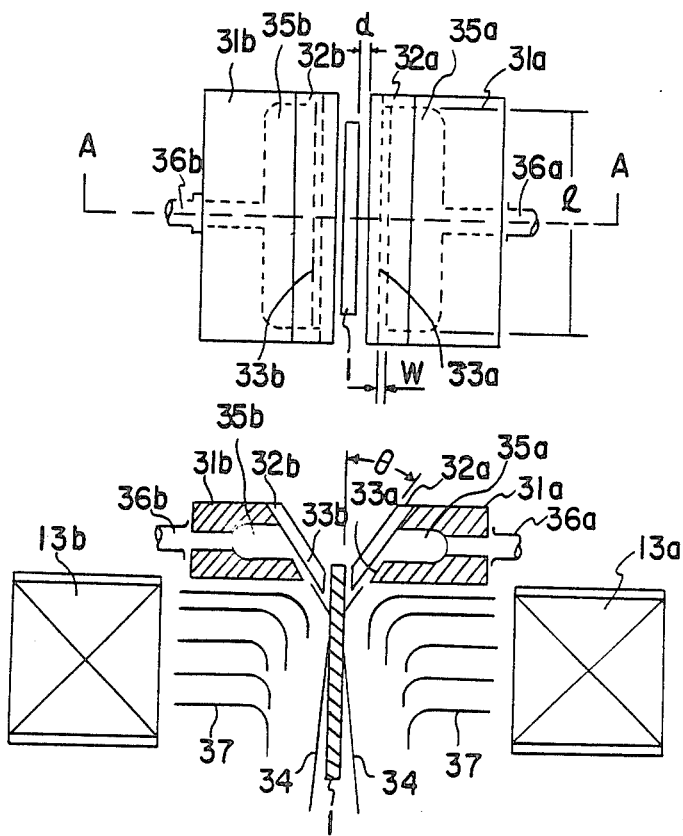

MASK WASHING APPARATUS FOR PRODUCTION OF INTEGRATED CIRCUIT

BACKGROUND OF THE INVENTION

1. Field of the Invention

This invention relates to an automatic mask (reticle) washing apparatus for the production of semiconductor integrated circuits (IC), and in particular, to cleaning a mask without the use of a strong oxidizing agent or strong alkaline agent.

2. Description of the Prior Art

In semiconductor device manufacturing, it is important to obtain a clean surface mask in order to attain high reliability of devices and high yield of production. There are apparatuses to clean the slices or substrates of semiconductors, but cleaning of the mask is done by hand. The reason the masks have been cleaned manually is that the number of masks used in the process is much smaller than that of the slices. But as the scale of production increases and the complexity of the IC is increased, the number of masks used in the process has become large.

The contamination or damage to the mask is due to the dust, mist, finger masks, spit, etc. In order to remove such contamination, hard washing is not desirable. Moreover, strong oxidizing or alkaline agents are also undesirable because of straining of the mask surface. The cleaning of the mask by hand has not been satisfactory and, therefore, apparatuses for washing and drying of the mask are beginning to be used.

By the experience of the inventor herein, it is insufficient to use prior art apparatuses for washing, drying and so on because during transportation between stages of the apparatus, the mask surface is exposed to the air and thus, contaminated. It is desirable, therefore, to use an apparatus which handles the mask automatically from loading the mask, washing, drying and taking out.

SUMMARY OF THE INVENTION

An object of the present invention, therefore, is to provide a washing apparatus for a mask (reticle) for semiconductor device production which can completely automate the mask loading and washing process for a high quality mask.

Another object of the present invention is to provide a washing apparatus which prevents the contamination of the mask by the atmosphere during the transportation of the mask.

The foregoing objects are attained by providing a specifically designed chamber. The mask is loaded from the top of the chamber and transported to the bottom of the chamber, then brought up gradually to the top of the chamber. During the transit, the mask is washed and scrubbed in a cleanser, rinsed by a pure water jet and dried by a clean air jet.

Further detail and advantage of the present invention will become clear from the accompanying drawings and the detailed description of the preferred embodiment.

BRIEF DESCRIPTION OF THE DRAWINGS

FIG. 4A illustrates a top view of a means for emitting a jet of gas to dry the mask of the present invention.

FIG. 4B is a sectional view along the line A—A of FIG. 4A illustrating the effect of the present invention.

DETAILED DESCRIPTION OF THE PREFERRED EMBODIMENT

Figure 1:
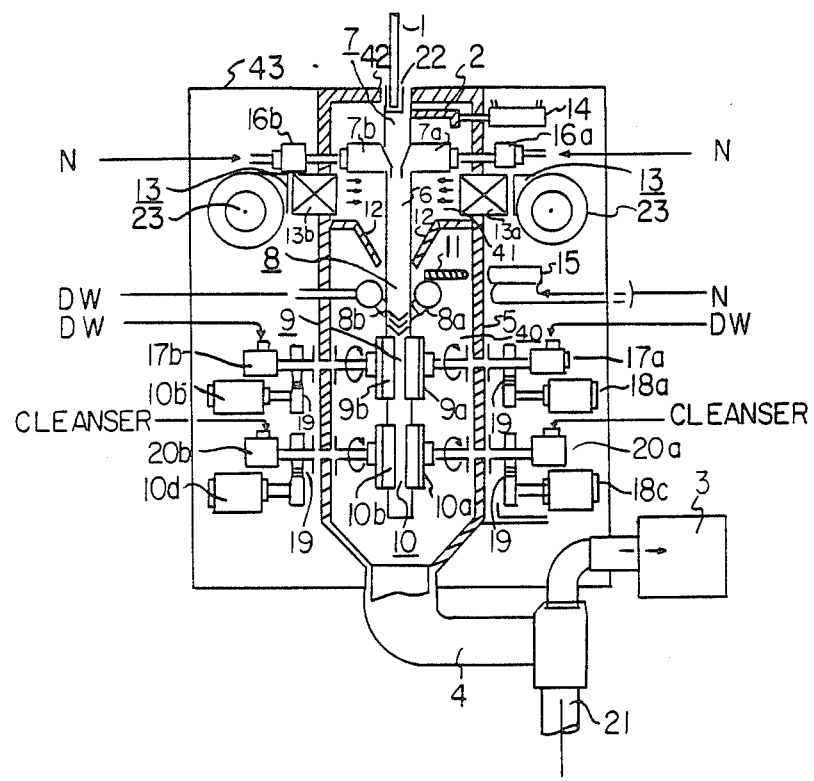
FIG. 1 shows schematically a sectional view of a mask washing apparatus of the present invention, illustrating the chamber thereof.

FIG. 1 shows schematically a view of a mask washing apparatus embodying the present invention. The main part of the mask washing apparatus 43 comprises an airtight chamber 5, which includes a mask loading gate 42, a washing space 40 and a drying space 41.

A first automatic shutter 2 is provided on the top of the chamber 5, the shutter 2 being controlled by a gas-cylinder 14. The shutter 2 is opened only when the mask 1 is loaded or unloaded.

The drying space 41 in the airtight chamber 5 is provided with a pair of nozzles 7a and 7b which emit a jet of gases to the mask surfaces. The mask is mounted on a mask transfer mechanim 6, movable up and down in the airtight chamber 5. A pair of air inlets 13 at the side of the airtight chamber 5 are respectively connected through a duct to blowers 23. The air taken into the airtight chamber 5 is filtered by micro air filters 13a and 13b.

The washing space 40, in the airtight chamber 5, is provided with a pair of jet nozzles 8a and 8b and two pairs of scrubbing pads 9a and 9b and 10a and 10b. The nozzles 8a and 8b jet distilled water to clean the mask. Each washing pad is rotated about an axis by motors 18a, 18b, 18c and 18d through transmissions 19. The airtight chamber 5 is provided with means 20a and 20b for supplying the cleanser, a drain 21 and a mask holder 22.

A separation wall 12, between the drying space 41 and the washing space 40, has a second shutter 11 which is controlled by a gas cylinder 15.

A device for exhausting gases is provided on the bottom of the airtight chamber 5, and comprises an exhaust fan 3, an exhaust duct 4 and a drain pipe 21.

The mask 1 is loaded on a mask holder 22, and is moved toward the bottom of the airtight chamber 5 by a mask transfer mechanism 6. When the mask 1 is inserted in the airtight chamber 5, the first shutter 2 is closed and when the mask 1 reaches to the bottom of the airtight chamber 5, the second shutter 11 is closed.

When the mask 1 reaches the bottom of the airtight chamber 5, it is positioned to face the scrubbing pads 10a and 10b in the washing space 40. In this position, both surfaces of the mask are washed with a cleanser. Cleanser is supplied to the scrubbing pads from the cleanser suppliers 20a and 20b, through a pipe which holds the pads. During the time for cleansing and scrubbing by the scrubbing pads 10a and 10b, the mask is gradually lifted up towards the top of the airtight chamber 5, at a speed of 3-4 mm/sec, for example. When the mask reaches the position of the scrubbing pads 9a and 9b, the mask is washed with distilled water. The water is supplied to the pads from the water suppliers 17a and 17b through the pipe which holds the pads. During the time for washing with distilled water and scrubbing by the scrubbing pads 9a and 9b, the mask is gradually lifted as mentioned above. Similarly, when the mask is lifted to the position of a pair of jet nozzles 8l and 8b, the nozzles emit distilled water jets. The jet streams blow off the water sheath covering the surface of the mask while the mask is gradually lifted.

After the washing with distilled water from the jet nozzles, the mask is blown by air to blow of the water drops on the surface of the mask. The air jet blows the mask from its upper side to the bottom of the chamber, this is intended to drop the water to the bottom of the chamber so it does not come up again to contact the mask. This situation will be described below in more detail with reference to FIG. 5. After the washing process is complete, the mask is lifted from the washing space 40 to the drying space 41 through the second shutter 11. The second shutter 11 is usually closed, but is opened by gas cylinder 15, when the mask passes through it.

In the drying space 41, the mask is dried by a pair of air-knife shaped nozzles 7a and 7b which emit a jet of dried nitrogen onto the mask. The knife nozzles will be discussed in more detail below with reference to FIG. 4. During this time, the mask is dried by air from the blowers 23 which have micro air filters 13a and 13b. After the drying of the mask is completed, the mask is taken out of the airtight chamber 5 through the first shutter 2.

Figure 2:
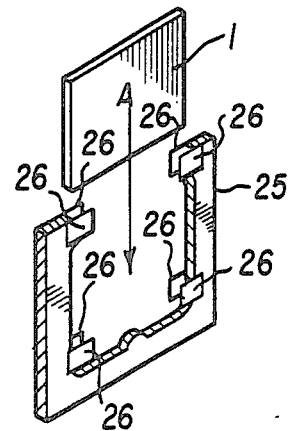
FIG. 2 is a front elevation perspective view of a portion of a mask holder of the present invention.

FIG. 2 is a front elevation perspective view of a portion of mask holder 22. The mask holder 22 comprises a frame 25 and holder springs 26, which are made of stainless steel. The size of the mask holder corresponds to the size of the mask. The mask 1 is inserted into the mask holder as shown by the arrow A and supported by the holder springs 26.

In the prior art, the mask drying was performed by a spin dryer or by means of natural drying, and sometimes it was performed by replacing the water with alcohol. Therefore, it was difficult to dry the mask speedily, moreover, the mask was contaminated during the drying process. The contamination was further increased when the mask was transported from one apparatus to the next apparatus. Moreover, the washing method of the prior art has some defects.

Figure 3:
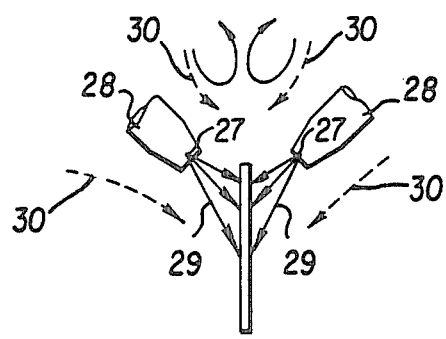
FIG. 3 shows schematically a prior art means for drying the mask by a jet of gas.

For example, FIG. 3 shows schematically a prior art means for drying the mask by a jet of gas. This type of nozzle is sometimes called an air-knife nozzle. The nozzle 28 emits a jet of a knife shaped gas flow 29 diagonally onto the mask 1. The V shaped slit 27 provides a thin planar stream. The width of the stream is equal to the width of the mask. The gas flow 29 from this type of nozzle spreads out as illustrated in FIG. 3, and it drags in the surrounding air as shown by broken line arrows 30. The stream of surrounding air catches the surrounding dust and the mask becomes contaminated. The contaminant is not only the dust in the air, but it may also be contamination which has been just removed from the mask. This destroys the cleaning effect of the washing apparatus.

In order to overcome such problems in the drying process of the present invention, the jet nozzle has been especially shaped. Namely, it provides a pair of air-knife nozzles 7a and 7b, which emit a jet of gas onto the mask. FIG. 4A illustrates a top view of the means for emitting a jet of gas by the present invention. FIG. 4B is a sectional view along the line A—A of FIG. 4A illustrating the effect of the invention.

The tips of the nozzle bodies 31a and 31b are inclined to the surface of the mask 1 at an angle $\theta$ (for example, 50-60 degrees), and cover plates 32a and 32b are fixed to the inclined surface of the tips. Orifices 33a and 33b have a width W between the nozzle body and cover plate, as shown in FIG. 4A. As a result, air-knives 34 are formed by the orifices 33a and 33b. The gas flow of the air-knives is directed downward along the surface of the mask 1. A gap d between the mask 1 and the cover plates 32a and 32b is set to less than one mm. The nozzle bodies 31a and 31b have cavities 35a and 35b which are connected to the gas pipes 36a and 36b respectively.

As shown in FIG. 4B, micro air filters 13a and 13b are positioned close to the nozzles 36a and 36b to provide dust free air flow 37 toward the mask 1. Moreover, the gas in the airtight chamber 5 is evacuated by a pump (not shown) from the bottom of the chamber. It will be apparent from the illustration that the air flow which is drawn into the knife-shaped air jet is prevented. Therefore, the contamination by drawn in air flow of the prior art is eliminated.

Figure 5A:
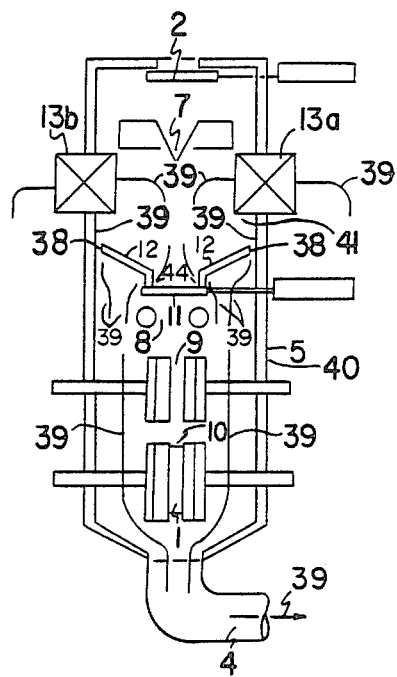
FIG. 5A illustrates schematically gas flow in the chamber when the washing apparatus is in a water washing cycle.
Figure 5B:
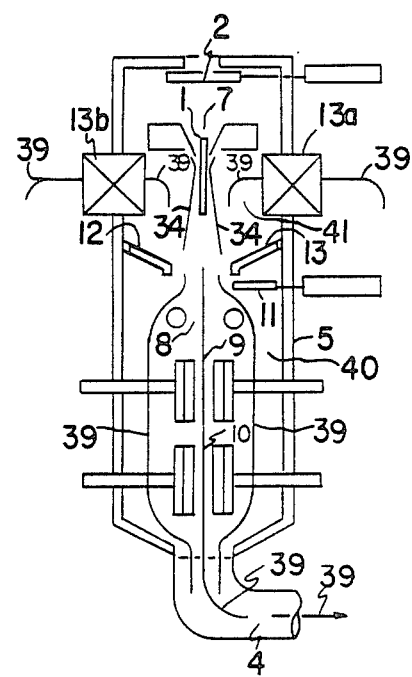
FIG. 5B illustrates schematically gas flow in the chamber when the washing apparatus is in a drying cycle.

FIG. 5A illustrates schematically gas flow in the chamber when the washing apparatus is in a water washing cycle, and FIG. 5B illustrates schematically gas flow in the chamber when the washing apparatus is in a drying cycle. Reference numerals in the figure designate the same or corresponding parts of the apparatus shown in FIG. 1.

During the washing of the mask 1, as shown in FIG. 5A, the first shutter 2 is closed, the outside air is taken in through the micro air filters 13a and 13b, and the pressure in the drying space is raised, so filtered air stream 39 flows into the washing space 40 through a gap 38 between the separation wall 12 and the side wall of the chamber 5. At the same time, the filtered air flows through the gap 44 between the separation wall 12 and the second shutter 11. The air flow described above prevents the mist of the washing water and the contaminated air from flowing back from the washing space 40 into the drying space 41. The mist and the contaminated air in the washing space 40 are exhausted from the drain and exhaust duct 4. Furthermore, the air flow prevents the mist from adhering to places in drying space 41.

During the drying cycle of the mask 1, as shown in FIG. 5B, the first shutter 2 is closed, but the second shutter 11 is opened. The outside air is introduced through the micro air filter 13a and 13b, so the filtered air stream 39 flows downward into the washing space 40, and a pair of air-knives 34 blow downward onto the mask 1, and the mask is rapidally dried.

Further, since the mask 1 is moving from down to up, and the air-knives 34 are directed from the upper portion to the lower portion of the mask 1, mist from the upper portion is prevented from flowing back towards the upper portion.

As has been described above, by using the automatic mask washing apparatus disclosed herein, it is impossible to clean a mask in the chamber without using a strong oxidizing agent or strong alkaline agent. Further, damage to the mask caused by dust and mist is avoided, and clean surfaces of the mask are obtained. Consequently, the reliability of the mask and the yield of the production are increased.

The present invention may be embodied in other specific forms without departing from the spirit or essential characteristics thereof. The presently disclosed embodiments are, therefore, to be considered in all respects as illustrative and not restrictive, the scope of the invention being indicated by the appended claims, rather than the foregoing description, and all changes which come within the meaning and range of equivalency of the claims are, therefore, to be embraced therein.

What is claimed is:

1. A mask washing apparatus for fabricating semiconductor devices comprising:
 a vertical, airtight chamber comprising a washing space for washing the mask and a drying space for drying said mask, wherein said drying space is positioned at an upper part of said chamber, and said washing space is positioned at a lower part of said chamber;
 a first shutter means located on the top of said chamber, wherein said first shutter means is closed during the washing process and the drying process and is opened during the loading or unloading of said mask;
 a second shutter means located between said drying space and said washing space, wherein said second shutter means is closed during said washing process, and is opened during said drying process;
 a drain and exhaust duct means, positioned at the bottom of said chamber, for exhausting gas and water from said chamber;
 a gas jet type drying means for drying said mask, said drying means being positioned below said first shutter means, and emitting a flat jet flow of gas downward on both sides of the substrate to be dried, wherein said gas jet type drying means includes at least two flat nozzles positioned on either side of the substrate to be dried, wherein the upper sides of said flat nozzles are provided with cover plates extending downward close to the surface of said substrate, and is inclined to the surface of said substrate at an angle of 50° to 60°, the lower sides of said flat nozzles and said cover plates providing an orifice therebetween to provide the flat gas flow;
 air flow means positioned underneath said gas jet type drying means for providing clean air flow beneath said drying means and towards the surface of the substrate to be dried, said air flow means including an air inlet means for taking in air into said airtight chamber, filter means for filterining the intake air, and a fan means for forming a stream of clean air, wherein said air flow means prevents dust or water mist from being dragged into said gas jet type dryer means; and
 washing means, positioned in said washing space for washing the mask,
 wherein an air stream flowing from the top to the bottom of said chamber is produced during the washing process and the drying process, said air stream flow preventing washed out dust or water mist from the cleaned surface of the washed substrate from being recycled.

2. A mask washing apparatus according to claim 1, wherein said air intake means further comprises a micro air filter for filtering the air outside said chamber.

3. A mask washing apparatus according to claim 1, wherein said drain and exhaust duct means comprises an exhaust and drain duct and an exhaust fan connected thereto.

4. A mask washing apparatus according to claim 1, wherein said washing space further comprises:
 a jet washing means for emitting a jet stream of distilled water on both sides of the mask;
 a scrub washing means for scrubbing the surface of the mask; and
 a cleaning means for washing the mask with cleanser.

5. A mask washing apparatus according to claim 1, further including:
 (a) inserting means for inserting the mask into said chamber; and
 (b) moving means for moving the mask through the chamber, said moving means being movable between the top and bottom of said chamber.

6. A mask washing apparatus according to claim 1, wherein each of said nozzles comprises:
 a nozzle body having a cavity connected to a gas supply means, the tip of said nozzle body being oriented diagonally across said nozzle;
 wherein said cover plate is fixed to the diagonal section of said nozzle body; and
 wherein said flat gas flow has a width wider than the width of the mask.

* * * * *